(12) United States Patent
Kohmura et al.

(10) Patent No.: US 10,606,169 B2
(45) Date of Patent: Mar. 31, 2020

(54) PELLICLE FRAME, PELLICLE CONTAINING SAME, METHOD FOR PRODUCING PELLICLE FRAME, AND METHOD FOR PRODUCING PELLICLE

(71) Applicant: MITSUI CHEMICALS, INC., Minato-ku, Tokyo (JP)

(72) Inventors: Kazuo Kohmura, Chiba (JP); Takashi Kozeki, Otake (JP); Daiki Taneichi, Chiba (JP); Shintaro Maekawa, Ichihara (JP); Yosuke Ono, Sodegaura (JP); Tsuneaki Biyajima, Otake (JP)

(73) Assignee: MITSUI CHEMICALS, INC., Minato-Ku, Tokyo (JP)

( * ) Notice: Subject to any disclaimer, the term of this patent is extended or adjusted under 35 U.S.C. 154(b) by 164 days.

(21) Appl. No.: 15/753,211

(22) PCT Filed: Aug. 15, 2016

(86) PCT No.: PCT/JP2016/073828
§ 371 (c)(1),
(2) Date: Feb. 16, 2018

(87) PCT Pub. No.: WO2017/030109
PCT Pub. Date: Feb. 23, 2017

(65) Prior Publication Data
US 2018/0239242 A1 Aug. 23, 2018

(30) Foreign Application Priority Data
Aug. 17, 2015 (JP) .................................. 2015-160519

(51) Int. Cl.
*G03F 1/64* (2012.01)
*B32B 15/08* (2006.01)
*C25D 11/22* (2006.01)

(52) U.S. Cl.
CPC ............... *G03F 1/64* (2013.01); *B32B 15/08* (2013.01); *B32B 2311/24* (2013.01); *B32B 2379/08* (2013.01); *C25D 11/22* (2013.01)

(58) Field of Classification Search
CPC ......................................................... G03F 1/64
USPC ............................................................. 430/5
See application file for complete search history.

(56) References Cited

U.S. PATENT DOCUMENTS

| 5,470,621 | A | 11/1995 | Kashida et al. |
| 2007/0292775 | A1 | 12/2007 | Hamada |
| 2010/0207293 | A1 | 8/2010 | Nakayama et al. |
| 2012/0122025 | A1 | 5/2012 | Murakami et al. |

FOREIGN PATENT DOCUMENTS

| JP | 7-043892 A | 2/1995 |
| JP | 2004-059997 A | 2/2004 |
| JP | 2007-332369 A | 12/2007 |
| JP | 2007-333910 A | 12/2007 |
| JP | 2009-091573 A | 4/2009 |
| JP | 2009-221398 A | 10/2009 |
| JP | 2009-256489 A | 11/2009 |
| JP | 2009-288265 A | 12/2009 |
| WO | WO 2011/007523 A1 | 12/2012 |

OTHER PUBLICATIONS

International Search Report (PCT/ISA/210) dated Nov. 1, 2016, by the Japanese Patent Office as the International Searching Authority for International Application No. PCT/JP2016/073828.
Written Opinion (PCT/ISA/237) dated Nov. 1, 2016, by the Japanese Patent Office as the International Searching Authority for International Application No. PCT/JP2016/073828.

*Primary Examiner* — Christopher G Young
(74) *Attorney, Agent, or Firm* — Buchanan Ingersoll & Rooney PC

(57) ABSTRACT

The purpose of the present invention is to provide: a pellicle frame which is not susceptible to deterioration even if irradiated with short-wavelength light such as excimer light, and which is not susceptible to generation of an outgas or foreign substance; and a pellicle which uses this pellicle frame. In order to achieve the above-described purpose, this pellicle frame for supporting the outer periphery of a pellicle film is configured to comprise a frame and a film that is formed on the surface of the frame and contains a polyimide resin.

8 Claims, 1 Drawing Sheet

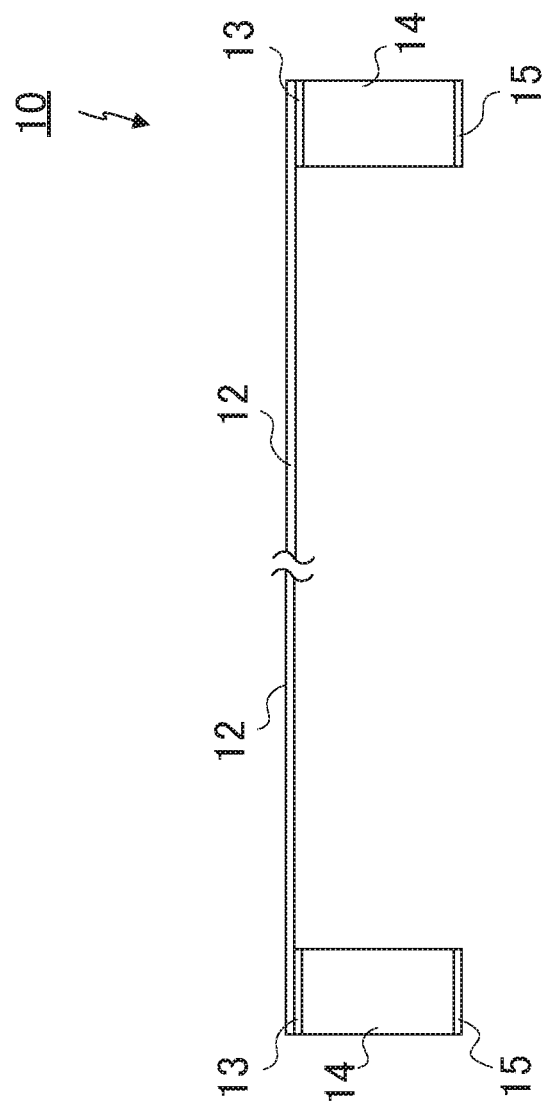

PELLICLE FRAME, PELLICLE CONTAINING SAME, METHOD FOR PRODUCING PELLICLE FRAME, AND METHOD FOR PRODUCING PELLICLE

TECHNICAL FIELD

The present invention relates to a pellicle frame, a pellicle including the same, a method for producing the pellicle frame, and a method for producing the pellicle.

BACKGROUND ART

During the process for producing semiconductor devices, such as an LSI and a VLSI, a liquid crystal display panel, and the like, various patterns are formed by irradiation with light via a mask (original plate for exposure). When a foreign particle is attached to the mask during the process, the foreign particle absorbs and/or refracts light. This causes reduction of patterning precision to impair the quality and/or appearance of the obtained device. Typically, a pellicle is attached on the surface of a mask to suppress attachment of foreign particles to the mask.

A pellicle is generally composed of a pellicle membrane capable of transmitting light for patterning, and a pellicle frame supporting the periphery of the pellicle membrane. The pellicle frame is composed of a metal such as an aluminum alloy, and may be subjected to anodizing treatment for surface protection. However, various ions such as sulfate ions are likely to remain in the pellicle frame subjected to anodizing treatment. In such a pellicle frame, the residual ions are outgassed to fog up the pellicle membrane, or react with other ions to cause foreign particles, and thus patterning precision becomes more likely to decrease.

To address the above problems, sealing the anodic oxide film is considered, however, the effect thereof is not satisfactory. Protecting of a frame is proposed by electrodepositing an acrylic resin, fluororesin or the like on the surface of the frame (e.g., PTL 1). Electrodepositing a thermosetting resin on the surface of the frame is also proposed (e.g., PTL 2). Further, electrodepositing an epoxy resin on the surface of the frame is also proposed (e.g., PTL 3).

CITATION LIST

Patent Literature

PTL 1
Japanese Patent Application Laid-Open No. H7-43892
PTL 2
Japanese Patent Application Laid-Open No. 2007-333910
PTL 3
WO2011/007523

SUMMARY OF INVENTION

Technical Problem

The electrodeposited coating described in PTL 1, which contains an acrylic resin, has a low film strength. This presents a problem in that the electrodeposited coating is more likely to be peeled from the frame during adhesion of the pellicle to an exposure mask, or transportation of the pellicle. As for the coating made from a fluororesin, dust caused by friction may be generated in a large amount when the surface of the pellicle frame is scraped during the process for producing the pellicle frame.

On the other hand, the electrodeposited coatings of PTLs 2 and 3 have relatively high film strength. However, those coatings are more likely to be degraded by light for patterning when the light is short-wavelength light (e.g., excimer light, such as KrF and ArF).

The present invention is made in view of such problems. The object of the present invention is to provide a pellicle frame which is less likely to not only be degraded by short-wavelength light, such as excimer light, but also outgas and generate foreign particles; a pellicle using the pellicle frame; and a method for producing the pellicle and the pellicle frame.

Solution to Problem

The present invention relates to a pellicle frame and a pellicle including the same as follows.

[1] A pellicle frame for supporting a periphery of a pellicle membrane, which includes: a frame, and a polyimide resin-containing film formed on a surface of the frame.

[2] The pellicle frame according to [1], in which the frame is an aluminum alloy frame subjected to anodizing treatment.

[3] The pellicle frame according to [1] or [2], in which the polyimide resin-containing film is an electrodeposited coating.

[4] The pellicle frame according to [3], in which the electrodeposited coating is a cured film of a composition containing a polycondensating polyimide resin, a thermally crosslinked imide resin and a cationic polymer.

[5] The pellicle frame according to any one of [1] to [4], in which the thickness of the polyimide resin-containing film is 25 µm or less.

[6] The pellicle frame according to any one of [1] to [5], in which the frame is black.

[7] A pellicle including: a pellicle membrane, and the pellicle frame according to any one of [1] to [6], which is for supporting a periphery of the pellicle membrane.

The present invention also relates to a method for producing a pellicle frame, and a method for producing a pellicle as follows.

[8] A method for producing a pellicle frame for supporting a periphery of a pellicle membrane, which includes: anodizing an aluminum alloy frame, subjecting the surface of the aluminum alloy frame to blackening treatment, and coating with a polyimide resin-containing coating material the aluminum alloy frame subjected to the blackening treatment, to form a polyimide resin-containing film.

[9] A method for producing a pellicle including a pellicle membrane for lithography and a pellicle frame for supporting a periphery of the pellicle membrane, which includes: adhering the pellicle membrane to the pellicle frame which is produced by the method according to [8] for producing the pellicle frame.

Advantageous Effects of Invention

According to the pellicle frame of the present invention, or the pellicle using the same, the pellicle frame is less likely to outgas and generate foreign particles. Therefore, highly precise patterning becomes possible due to a mask for patterning and/or a pellicle membrane each free from contamination.

BRIEF DESCRIPTION OF DRAWINGS

FIG. 1 is a cross-sectional view schematically illustrating an example of a pellicle structure of the present invention.

DESCRIPTION OF EMBODIMENTS

Hereinafter, an embodiment of the present invention will be described in detail.

As used herein, a numerical range represented by using the word "to" is a range including numerical numbers before and after the word "to" as the lower limit and the upper limit, respectively.

1. Pellicle Frame

A pellicle frame of the present invention includes a frame and a polyimide resin-containing film formed on the frame surface.

As described above, when an anodic oxide film is formed on the surface of a pellicle frame, it is more likely that ions attached during anodizing treatment are outgassed or eluted to become foreign particles, thereby contaminating a mask and/or a pellicle membrane. A film composed of a fluororesin, acrylic resin, epoxy resin or the like does not have satisfactory film strength, heat resistance, abrasion resistance, light resistance and/or the like, and is more likely to be degraded.

The pellicle frame of the present invention includes a polyimide resin-containing film on the surface thereof. A polyimide resin has extremely high resistance to light and heat, and is resistant to decomposition by, for example, excimer light. The polyimide resin-containing film has extremely high adherence to a metal frame. Therefore, the polyimide resin-containing film is less likely to be peeled from the frame during production of the pellicle frame, adhesion of the pellicle to an exposure mask, and/or transportation of the pellicle. The polyimide resin-containing film can also reduce ion elution even from a frame which is subjected to anodizing treatment. Accordingly, a pellicle including the pellicle frame is extremely advantageous as a protection member for various exposure masks.

During inspection processes, such as receiving inspection for pellicle frames, and shipping inspection for pellicles which include a pellicle membrane attached to a pellicle frame, the pellicle frames and pellicles are inspected for the presence of dust attached thereon. During the receiving inspection for pellicle frames, the pellicle frame is inspected for the presence of dust by irradiating the pellicle frame with strong light to see whether the light is reflected or not. When invisible size of dust is present, the emitted light is reflected and thus the dust glints. Only a pellicle frame which does not reflect light is determined as qualified.

Hereinafter, a polyimide resin-containing film in a pellicle frame of the present invention and a frame therefor will be described.

1-1. Frame

The shape of a frame in the pellicle frame of the present invention is selected as appropriate in accordance with the shape of a mask for adhesion to a pellicle. Any metal can be used as the material for the frame as long as a polyimide resin-containing film can be formed on the surface of the metal. Examples of such metals include aluminum, aluminum alloys, magnesium alloys, titanium, brass, iron and stainless steel. Aluminum alloys are preferable in view of weight, workability, durability and/or the like. The frame composed of an aluminum alloy is also preferable in view of easy formation of the polyimide resin-containing film thereon by electrodeposition coating.

The frame may be subjected to surface treatment, such as plasma treatment, roughening, sandblasting, shot-blasting or the like. Such treatment can remove foreign particles and/or an oil component attached to the surface. Therefore, subjecting the frame to the surface treatment is likely to increase adherence of the frame to the polyimide resin-containing film. When the frame surface is roughened by the above treatment, the surface of the pellicle frame becomes more likely to be matted and thus foreign particles attached to the surface of the pellicle frame can be detected more easily.

It is preferred that the frame include an anodic oxide film formed by anodizing treatment in view of chemical stability and/or the like of the pellicle frame. Any method and/or conditions for anodizing the frame may be used as long as the effect of the present invention is not impaired, and various conventional anodizing methods may be applied. For example, a known anodizing method using sulfuric acid, phosphoric acid, nitric acid, tartaric acid or the like may be applied. The pellicle frame of the present invention includes a polyimide resin-containing film described below on the surface of its frame, and thus various ions are less likely to be eluted to the surface of the pellicle frame even when the frame is subjected to the anodizing treatment. In particular, subjecting the frame to anodizing treatment with tartaric acid is more likely to reduce elution of ions to the surface of the pellicle frame and generation of outgassing. The anodic oxide film is preferably an aluminum oxide film with a thickness of 5 µm or more and 70 µm or less, which has holes with a diameter of 10 µm or more and 30 µm or less.

After subjecting to the anodizing treatment, the frame may be colored in black (blackening treatment) by further treatment, such as electrolytic deposition. When the frame is black, i.e., the pellicle frame is black, stray light is suppressed, and thus dust can be more easily confirmed during receiving inspection for pellicle frames in which the pellicle frame is irradiated with light to be inspected for the presence of dust by reflection of the light. Any metal can be deposited on the frame surface by the electrolytic deposition, and may be nickel (Ni), cobalt (Co), copper (Cu), tin (Sn), manganese (Mn), iron (Fe) or the like.

The frame may be colored in black by dyeing the frame with a black dye. Any known method may be used for dyeing the frame with a black dye. For example, known is a method in which an organic dye or the like is permeated through the film formed by the anodizing treatment, thereby coloring the film in black.

1-2. Polyimide Resin-Containing Film

A polyimide resin-containing film is a film formed on the frame surface. The thickness of the polyimide resin-containing film is preferably 0.5 µm or more and less than 30 µm, more preferably 5 µm or more and less than 30 µm, and still more preferably 7 µm or more and 25 µm or less.

The polyimide resin-containing film can be formed by any one of various methods for coating the frame surface with a polyimide coating material. Specific examples of the coating methods include spray coating, electrodeposition coating and dip coating; and spray coating and electrodeposition coating are preferred. The polyimide coating material is selected in accordance with the coating method as appropriate. In the following, a film formed by spray coating (also referred to as "sprayed coating") and a film formed by electrodeposition coating (also referred to as "electrodeposited coating") will be described.

1-2-1. Sprayed Coating

A sprayed coating is a film formed by spray coating on the frame surface, and contains a polyimide resin. In the case where a polyimide resin-containing film is formed by spray coating, the concentration of a polyimide or a precursor thereof is adjusted with a diluent, and the diluted coating material is sprayed with high-pressure air from spray nozzles of a spray coating apparatus. Particles of the coating material sprayed from the spray nozzles are uniformly attached to the above-mentioned frame, and cured by heating or the like as necessary.

Any generally used polyimide coating material may be used for application by spray coating. Examples of such coating materials include coating materials described in Japanese Patent Application Laid-Open Nos. 2009-221398, 2009-091573 and 2007-332369.

1-2-2. Electrodeposited Coating

An electrodeposited coating is a film formed by electrodeposition coating on the frame surface, and contains a polyimide resin. The electrodeposited coating may be formed by cationic electrodeposition coating or anionic electrodeposition coating. For obtaining a film with satisfactory appearance, i.e., a flat surface state, the cationic electrodeposition coating is preferred for forming the film.

An electrodeposited coating can be obtained by electrodepositing a composition for electrodeposition which contains a polyimide resin, a precursor or modified product thereof or the like, in a method as described below. Hereinafter, examples of compositions for cationic electrodeposition used for cationic electrodeposition coating will be described; however, compositions for electrodeposition are not limited thereto.

(Composition for Cationic Electrodeposition)

A composition for cationic electrodeposition may contain, for example, a polyimide resin (A), a cationic polymer (B), a neutralizer (C) and an aqueous medium (D). The composition for cationic electrodeposition may contain a cation-modified polyimide resin (A') obtained by cationic modification of a polyimide resin in place of the polyimide resin (A) and the cationic polymer (B). The composition for cationic electrodeposition may further contain a pigment (E) and/or additional component(s) (F) as necessary. Hereinafter, these components (A) to (F) will be described.

(A) Polyimide Resin

The composition for cationic electrodeposition may contain any polyimide resin. From the view point of increasing the heat resistance and/or light resistance of the electrodeposited coating, the polyimide resin (A) preferably contains a "polycondensating polyimide resin" having a repeating unit represented by general formula (1) below. The "polycondensating polyimide resin" described in the present invention is a polyimide resin obtained by polycondensation of a tetracarboxylic dianhydride and a diamine, and may be an all-aromatic polyimide, an all-aliphatic polyimide or a semi-aromatic (semi-aliphatic) polyimide. However, the polycondensating polyimide resins exclude a "thermally crosslinked imide resin" described below.

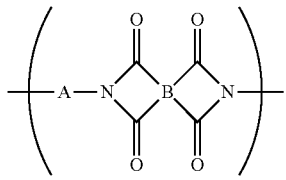

(1)

In general formula (1), A is selected from divalent groups represented by the following general formulae.

—$Z_1$—,

—$Z_2$—$X_1$—$Z_3$—,

—$Z_4$—$X_2$—$Z_5$—$X_3$—$Z_6$—, and

—$Z_7$—$X_4$—$Z_8$—$X_5$—$Z_9$—$X_6$—$Z_{10}$—

In the above general formulae, $Z_1$ to $Z_{10}$ are independently phenylenediamine residue, naphthalenediamine residue, anthracenediamine residue, phenanthrenediamine residue, alkanediamine residue having a moiety of general formula $C_xH_{2x}$ with x being 6 to 12, cyclobutanediamine residue, cyclohexanediamine residue, cycloheptanediamine residue, cyclodecanediamine residue, diaminobicyclohexane residue, diaminobicycloheptane residue, norbornanediamine residue or isophoronediamine residue. $X_1$ to $X_6$ are independently a single bond, —O—, —S—, —CO—, —COO—, —C(CH$_3$)$_2$—, —C(CF$_3$)$_2$—, —SO$_2$— or —NHCO—. $Z_1$ to $Z_{10}$ contained in the plurality of As may be the same or different. The same applies for $X_1$ to $X_6$.

A divalent group which may be A in general formula (1) and contains an aromatic ring may be a divalent group derived from an aromatic diamine. Examples of the aromatic diamine include m-phenylenediamine, o-phenylenediamine, p-phenylenediamine, 1,4-diaminonaphthalene, 1,5-diaminonaphthalene, 1,8-diaminonaphthalene, 2,6-diaminonaphthalene, 2,7-diaminonaphthalene, 2,6-diaminoanthracene, 2,7-diaminoanthracene, 1,8-diaminoanthracene, 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 3,3'-diaminobenzophenone, 3,3'-diaminodiphenylmethane, 3,4'-diaminodiphenylmethane, 4,4'-diaminodiphenylmethane, 2,2-bis(3-aminophenyl) propane, 2,2-bis(4-aminophenyl) propane, 2,2-bis(3-aminophenyl)-1,1,1,3,3,3-hexafluoropropane, 2,2-bis(4-aminophenyl)-1,1,1,3,3,3-hexafluoropropane, 3,3'-diaminodiphenyl sulfoxide, 3,4'-diaminodiphenyl sulfoxide, 4,4'-diaminodiphenyl sulfoxide, 1,3-bis(3-aminophenyl) benzene, 1,3-bis(4-aminophenyl)benzene, 1,4-bis(3-aminophenyl)benzene, 1,4-bis(4-aminophenyl)benzene, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminophenyl sulfide) benzene, 1,3-bis(4-aminophenyl sulfide)benzene, 1,4-bis(4-aminophenyl sulfide)benzene, 1,3-bis(3-aminophenyl sulfone)benzene, 1,3-bis(4-aminophenyl sulfone)benzene, 1,4-bis(4-aminophenyl sulfone)benzene, 1,3-bis(3-aminobenzyl) benzene, 1,3-bis(4-aminobenzyl) benzene, 1,4-bis(4-aminobenzyl) benzene, 1,3-bis(3-amino-4-phenoxy benzoyl)benzene, 3,3'-bis(3-aminophenoxy) biphenyl, 3,3'-bis(4-aminophenoxy)biphenyl, 4,4'-bis(3-aminophenoxy) biphenyl, 4,4'-bis(4-aminophenoxy) biphenyl, bis[3-(3-aminophenoxy)phenyl] ether, bis[3-(4-aminophenoxy) phenyl] ether, bis[4-(3-aminophenoxy)phenyl] ether, bis[4-(4-aminophenoxy)phenyl] ether, bis[3-(3-aminophenoxy) phenyl] ketone, bis[3-(4-aminophenoxy)phenyl] ketone, bis [4-(3-aminophenoxy)phenyl] ketone, bis[4-(4-aminophenoxy)phenyl] ketone, bis[3-(3-aminophenoxy) phenyl] sulfide, bis[3-(4-aminophenoxy)phenyl] sulfide, bis [4-(3-aminophenoxy)phenyl] sulfide, bis[4-(4-aminophenoxy)phenyl] sulfide, bis[3-(3-aminophenoxy) phenyl] sulfone, bis[3-(4-aminophenoxy)phenyl] sulfone, bis[4-(3-aminophenoxy)phenyl] sulfone, bis[4-(4-aminophenoxy)phenyl] sulfone, bis[3-(3-aminophenoxy)phenyl] methane, bis[3-(4-aminophenoxy)phenyl]methane, bis[4-(3-aminophenoxy)phenyl]methane, bis[4-(4-aminophenoxy) phenyl]methane, 2,2-bis[3-(3-aminophenoxy)phenyl]

propane, 2,2-bis[3-(4-aminophenoxy)phenyl]propane, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,1,3,3,3-hexafluoropropane, 2,2-bis[3-(4-aminophenoxy)phenyl]-1,1,1,1,3,3,3-hexafluoropropane, 2,2-bis[4-(3-aminophenoxy)phenyl]-1,1,1,1,3,3,3-hexafluoropropane, 2,2-bis[4-(4-aminophenoxy)phenyl]-1,1,1,3,3,3-hexafluoropropane. One or more types of groups derived from the above diamines may be contained in the polyimide resin.

Preferred examples of the aromatic diamines include m-phenylenediamine, o-phenylenediamine, p-phenylenediamine, 3,3'-diaminodiphenyl ether, 3,4'-diaminodiphenyl ether, 4,4'-diaminodiphenyl ether, 3,3'-diaminodiphenyl sulfone, 4,4'-diaminodiphenyl sulfone, 3,3'-diaminobenzophenone, 3,3'-diaminodiphenylmethane, 4,4'-diaminodiphenylmethane, 1,3-bis(3-aminophenoxy)benzene, 1,3-bis(4-aminophenoxy)benzene and 4,4'-bis(3-aminophenoxy)biphenyl. More preferred are m-phenylenediamine, o-phenylenediamine, p-phenylenediamine, 3,3'-diaminodiphenyl ether, 3,4'-diaminodiphenyl ether, 4,4'-diaminodiphenyl ether, 4,4'-bis(3-aminophenoxy)biphenyl and 1,3-bis(3-aminophenoxy)benzene.

A divalent group which may be A in general formula (1), and is an alkenyl group or contains an alicyclic structure may be a divalent group derived from an aliphatic diamine or an alicyclic diamine. Preferred examples of the aliphatic diamines and alicyclic diamines include 1,5-diaminopentane, 1,6-diaminohexane, cyclobutanediamine, cyclohexanediamine, bis(aminomethyl)cyclohexane, diaminobicycloheptane, norbornanediamine, diaminomethylbicycloheptane, diaminooxybicycloheptane, oxanorbornanediamine, diaminomethyloxybicycloheptane, isophoronediamine, diaminotricyclodecane, diaminomethyltricyclodecane, bis(aminocyclohexyl)methane and bis(aminocyclohexyl)isopropylidene. Cyclohexanediamine, 1,4-bis(aminomethyl)cyclohexane and diaminomethylbicycloheptane are more preferred as the aliphatic diamines. One or more types of groups derived from the above diamines may be contained in the polyimide resin of the present invention. Either one or both types of the groups derived from the aromatic diamine and the aliphatic diamine may be contained.

In general formula (1), B is selected from tetravalent groups represented by the following general formulae.

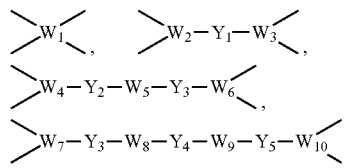

In the above general formulae, $W_1$ to $W_{10}$ are independently a tetravalent group containing an aromatic ring, such as benzene, naphthalene, anthracene, phenanthrene or perylene; or a tetravalent group containing an alicyclic structure, such as cyclobutane, cyclopentane, cyclohexane, cyclodecane, bicycloheptanes, bicyclooctanes or tetrahydrofurans. $Y_1$ to $Y_5$ are independently a single bond, —O—, —S—, —CO—, —COO—, —C(CH$_3$)$_2$—, —C(CF$_3$)$_2$—, —SO$_2$— or —NHCO—. $W_1$ to $W_{10}$ contained in the plurality of Bs may be the same or different. The same applies for $Y_1$ to $Y_5$.

A tetravalent group which may be B in general formula (1) and contains an aromatic ring may be a tetravalent group derived from a tetracarboxylic dianhydride containing an aromatic ring. Examples of the tetracarboxylic dianhydrides containing an aromatic ring include pyromellitic dianhydride, 3,3',4,4'-biphenyltetracarboxylic dianhydride, 2,3,3',4-biphenyltetracarboxylic dianhydride, 3,3',4,4'-benzophenonetetracarboxylic dianhydride, 3,3',4,4'-diphenylsulfonetetracarboxylic dianhydride, 4,4'-oxydiphthalic dianhydride, 1,2,4,5-naphthalenetetracarboxylic dianhydride, 1,2,5,6-naphthalenetetracarboxylic dianhydride, 1,2,6,7-naphthalenetetracarboxylic dianhydride, 1,4,5,8-naphthalenetetracarboxylic dianhydride, 2,3,6,7-naphthalenetetracarboxylic dianhydride, 2,3,6,7-anthracenetetracarboxylic dianhydride, 1,2,5,6-anthracenetetracarboxylic dianhydride, 1,2,6,7-phenanthrenetetracarboxylic dianhydride, 1,2,7,8-phenanthrenetetracarboxylic dianhydride, 1,2,9,10-phenanthrenetetracarboxylic dianhydride, 3,4,9,10-perylenetetracarboxylic dianhydride, bis(3,4-dicarboxyphenyl)ether dianhydride, bis(3,4-dicarboxyphenyl)sulfide dianhydride, bis(3,4-dicarboxyphenyl)sulfone dianhydride, bis(3,4-dicarboxyphenyl)methane dianhydride, 2,2-bis(3,4-dicarboxyphenyl)propane dianhydride, 2,2-bis(3,4-dicarboxyphenyl)-1,1,1,3,3,3-hexafluoropropane dianhydride, 1,3-bis(3,4-dicarboxyphenoxy)benzene dianhydride, 1,4-bis(3,4-dicarboxyphenoxy)benzene dianhydride, 1,4-bis(3,4-dicarboxyphenoxy)biphenyl dianhydride, and 2,2-bis[(3,4-dicarboxyphenoxy)phenyl]propane dianhydride.

A tetravalent group which may be B in general formula (1) and contains an alicyclic structure may be a tetravalent group derived from a tetracarboxylic dianhydride containing an alicyclic structure. Preferred examples of the tetracarboxylic dianhydrides containing an alicyclic structure include cyclobutanetetracarboxylic dianhydride, 1,2,3,4-cyclopentanetetracarboxylic dianhydride, 1,2,4,5-cyclohexanetetracarboxylic dianhydride, bicyclo[2.2.1]heptane-2,3,5,6-tetracarboxylic dianhydride, bicyclo[2.2.2]oct-7-ene-2,3,5,6-tetracarboxylic dianhydride, bicyclo[2.2.2]octane-2,3,5,6-tetracarboxylic dianhydride, 2,3,5-tricarboxycyclopentylacetic dianhydride, bicyclo[2.2.1]heptane-2,3,5-tricarboxylic-6-acetic dianhydride, 1-methyl-3-ethylcyclohexa-1-ene-3-(1,2),5,6-tetracarboxylic dianhydride, decahydro-1,4,5,8-dimethanonapthalene-2,3,6,7-tetracarboxylic dianhydride, 4-(2,5-dioxotetrahydrofuran-3-yl)-tetralin-1,2-dicarboxylic dianhydride, and 3,3',4,4'-dicyclohexyltetracarboxylic dianhydride.

Preferred examples of the tetracarboxylic dianhydrides include pyromellitic dianhydride, 3,3',4,4'-biphenyltetracarboxylic dianhydride, 2,3,3',4-biphenyltetracarboxylic dianhydride, 3,3',4,4'-benzophenonetetracarboxylic dianhydride, 4,4'-oxydiphthalic dianhydride, 3,3',4,4'-diphenylsulfonetetracarboxylic dianhydride, 2,2-bis[(3,4-dicarboxyphenoxy)phenyl]propane dianhydride, 2,2-bis(3,4-dicarboxyphenyl)-1,1,1,3,3,3-hexafluoropropane dianhydride, cyclobutanetetracarboxylic dianhydride and 1,2,4,5-cyclohexanetetracarboxylic dianhydride. Particularly preferred are pyromellitic dianhydride, 3,3',4,4'-biphenyltetracarboxylic dianhydride, 2,2-bis[(3,4-dicarboxyphenoxy)phenyl]propane dianhydride, 2,2-bis(3,4-dicarboxyphenyl)-1,1,1,3,3,3-hexafluoropropane dianhydride, cyclobutanetetracarboxylic dianhydride and 1,2,4,5-cyclohexanetetracarboxylic dianhydride. One or more types of groups derived from the above dianhydrides may be contained in the polyimide resin of the present invention. Either one or both types of the groups derived from the aromatic dianhydride and the aliphatic dianhydride may be contained.

The composition for cationic electrodeposition contains preferably 5 to 50 mass %, more preferably 10 to 40 mass % of the polycondensating polyimide resin. When the amount of the polycondensating polyimide resin falls within the above range, dispersibility in an aqueous medium (D) is more likely to increase.

The polyimide resin (A) preferably contains a "thermally crosslinking imide resin" in addition to the "polycondensating polyimide resin." The "thermally crosslinking imide resin" in the present invention is a resin which contains an imide bond and a group capable of thermally crosslinking, such as an unsaturated double bond at the molecular terminal. The thermally crosslinking imide resin has high compatibility with the above-mentioned polycondensating polyimide resin and also with a cationic polymer (B) described below. Therefore, when the composition for cationic electrodeposition contains the thermally crosslinking imide resin, dispersibility of the polycondensating polyimide resin in an aqueous medium and/or deposition of the polycondensating polyimide resin during cationic electrodeposition is more likely to increase. Further, the thermally crosslinking imide resin forms crosslinked structures by the reaction between molecules of the thermally crosslinking imide resin, or the group capable of thermally crosslinking in the thermally crosslinking imide resin and —OH group and/or the like in the cationic polymer (B). Adding of the thermally crosslinking imide resin to the composition for cationic electrodeposition is thus more likely to increase the film strength of the electrodeposited coating to be obtained.

Examples of the thermally crosslinking imide resins include N,N'-m-xylenebismaleimide, N,N'-4,4'-diphenylmethanebismaleimide, 2,2-bis[4-(4-maleimidephenoxy)phenyl]propane, N,N'-m-phenylenebismaleimide, N,N'-4,4'-diphenyletherbismaleimide, N,N'-m-xylenebisnadimide and N,N'-4,4'-diphenylmethanebisallylnadimide.

The composition for cationic electrodeposition contains preferably 10 to 80 mass %, more preferably 15 to 60 mass % and still more preferably 20 to 50 mass % of the thermally crosslinking imide resin. When the amount of the thermally crosslinking imide resin falls within the above range, the dispersibility of the polycondensating polyimide resin and/or the like in an aqueous medium (D), and the strength of the electrodeposited coating are more likely to increase.

(B) Cationic Polymer

The cationic polymer (B) may be a polymer containing at least one cationic group, such as an amino group or a quaternary salt of an amino group. When the composition for cationic electrodeposition contains the cationic polymer (B), the polyimide resin (A) can be deposited on the on the frame surface due to, e.g., the compatibility between the cationic polymer (B) and the polyimide resin (A), without directly introducing a cationic group into the polyimide resin (A). The cationic polymer (B) may be, for example, an acrylic copolymer or an epoxy-amine adduct resin.

Examples of the acrylic copolymers include copolymers obtained by copolymerization of an amino derivative of a (meth)acrylic acid, a hydroxy derivative of a (meth)acrylic acid and a vinyl ester. Herein, the "(meth)acrylic" refers to either one or both of acrylic and methacrylic.

Examples of the amino derivatives of (meth)acrylic acids include dimethylaminoethyl (meth)acrylate, diethylaminoethyl (meth)acrylate and ethyltrimethylammonium chloride (meth)acrylate. Examples of the hydroxy derivatives of (meth)acrylic acids include 2-hydroxyethyl (meth)acrylate, 3-hydroxypropyl (meth)acrylate, 4-hydroxybutyl (meth)acrylate and 2-hydroxy-3-phenoxypropyl (meth)acrylate. Examples of the vinyl esters include methyl (meth)acrylate, 2-ethylhexyl (meth)acrylate, n-butyl (meth)acrylate, isobutyl (meth)acrylate, benzyl (meth)acrylate, cyclohexyl (meth)acrylate, isobornyl acrylate, 2-(perfluorooctyl)ethyl methacrylate and trifluoromethyl methacrylate.

The epoxy-amine adduct resin may be, e.g., a derivative obtained by modification of an epoxy group of an epoxy resin with a primary amine or a secondary amine. Examples of epoxy resins include bisphenol A type epoxy resins (Trade name: jER Resins 828, 834, 1001, 1004, 1007 and 1009, manufactured by Mitsubishi Chemical) and phenol novolac type epoxy resins (Trade name: jER Resins 152 and 154, manufactured by Mitsubishi Chemical).

Examples of the primary amines for the modification of the epoxy resin include monomethanolamine, monoethanolamine, mono-n-propanolamine, monoisopropanolamine, dimethylaminoethylamine, diethylaminoethylamine and diethylaminopropylamine. Examples of the secondary amines include dimethanolamine, diethanolamine, di-n-propanolamine, diisopropanolamine, methylethanolamine, methylpropanolamine and di-n-butylamine.

The composition for cationic electrodeposition contains preferably 10 to 70 mass %, more preferably 20 to 70 mass % and still more preferably 30 to 60 mass % of the cationic polymer (B). When the amount of the cationic polymer (B) falls within the above range, the dispersibility of the polyimide resin (A) in an aqueous medium (D) is more likely to increase. When the amount of the cationic polymer (B) falls within the above range, the amount of the polyimide resin (A) becomes satisfactorily high as a result, and thus the heat resistance and/or the like of the electrodeposited coating may satisfactorily increase.

(A') Cation-Modified Polyimide Resin

As described above, the composition for cationic electrodeposition may contain a cation-modified polyimide resin (A') in place of the polyimide resin (A) and the cationic polymer (B). When the composition for cationic electrodeposition contains the cation-modified polyimide resin (A'), it is not necessary for the composition for cationic electrodeposition to additionally contain the cationic polymer (B) composed of the acrylic resin, epoxy resin or the like. This may further increase the heat resistance of the electrodeposited coating.

The cation-modified polyimide resin (A') may be a resin in which a cationic group is bonded to the polyimide resin (A) through a urea bond or a urethane bond. Examples of the cationic groups include primary amino groups, secondary amino groups and tertiary amino groups. The following is an example of a method for bonding a cationic group to the polyimide resin (A).

A blocked isocyanate group is introduced into the polyimide resin (A) by the reaction of an acid anhydride group of the polyimide resin (A) with a "polyfunctional blocked isocyanate compound." The cation-modified polyimide resin (A') can be obtained by the reaction of the blocked isocyanate group with a "cationic group-containing compound" in a known method (e.g., a method described in Japanese Patent Application Laid-Open No. 2009-256489).

Examples of "polyfunctional blocked isocyanate compounds" for the reaction with the polyimide resin include aliphatic diisocyanates, such as hexamethylene diisocyanate, aromatic diisocyanates, such as 4,4-diphenylmethane diisocyanate, 2,6'-tolylene diisocyanate, alicyclic diisocyanates, such as isophorone diisocyanate, and more than two-functional isocyanates, such as polymeric MDI (e.g., Millionate MR-200 manufactured by Tosoh Corporation). One or more of these compounds may be used.

Examples of the "cationic group-containing compounds" include polyfunctional amines, hydroxyl group-containing amines, ketiminated amines and hydroxyl group-containing ketimines. One or more of these compounds may be used.

The polyfunctional amine may be any compound having two or more amino groups per molecule, and examples thereof include N,N'-dimethylethylenediamine, N,N'-dimethylpropylenediamine, ethylenediamine, propylenediamine and diethylenetriamine.

Examples of the hydroxyl group-containing amines include alkanolamines, such as ethanolamine, propanolamine, isopropanolamine, N-methylethanolamine, N-methyldiethanolamine and N,N-dimethylethanolamine.

Examples of the ketiminated amines include ketiminated amines each obtained by the reaction of the above-mentioned polyfunctional amine with a ketone, such as acetone, methyl ethyl ketone or methyl isobutyl ketone.

Examples of the hydroxyl group-containing ketimines include hydroxyl group-containing ketimines each obtained by the reaction of the above-mentioned ketone with an aminoalkylalkanolamine, such as aminoethylethanolamine, aminoethylpropanolamine, aminoethylisopropanolamine, aminopropylethanolamine or aminopropylisopropanolamine.

The composition for cationic electrodeposition contains preferably 5 to 70 mass %, more preferably 10 to 60 mass % of the cation-modified polyimide resin (A'). When the amount of the cation-modified polyimide resin (A') falls within the above range, the heat resistance and/or the like of the electrodeposited coating may satisfactorily increase, and further, the electrodeposited coating can be efficiently formed.

(C) Neutralizer

The composition for cationic electrodeposition contains a neutralizer for improving the dispersibility of the cationic polymer (B) or the cation-modified polyimide resin (A') in an aqueous medium. Examples of the neutralizers include inorganic acids and organic acids, such as hydrochloric acid, nitric acid, phosphoric acid, formic acid, acetic acid, lactic acid, succinic acid and butyric acid. The composition for cationic electrodeposition preferably contains the neutralizer in a range such that the pH thereof becomes 3 to 5.

(D) Aqueous Medium

The aqueous medium contained in the composition for cationic electrodeposition is, for example, ion-exchange water or pure water. The aqueous medium may contain a small amount of alcohol or the like as necessary. The amount of the aqueous medium contained in the composition for cationic electrodeposition is determined in accordance with the viscosity and/or the like of the composition for cationic electrodeposition as appropriate.

(E) Pigment

The composition for cationic electrodeposition may contain a pigment, such as carbon black. When the pellicle frame is blackened with the cationic electrodeposited coating, dust attached to the pellicle frame surface can be more easily confirmed, as described above.

The pigment content is typically 1 to 35 mass %, preferably 10 to 30 mass %, based on the total solid content of the composition for cationic electrodeposition.

(F) Additional Component

The composition for cationic electrodeposition may further contain additional component(s) as necessary. Examples of the additional components include water-miscible organic solvents, surfactants, antioxidants and UV absorbers.

The composition for cationic electrodeposition may be a composition prepared from the above-mentioned components, or a commercially available composition for electrodeposition. An example of the commercially available composition for electrodeposition is, for example, ELECOAT PI manufactured by Shimizu co., Ltd.

(Electrodeposition Coating Method)

An electrodeposited coating is formed by the steps of: 1) forming a film of the above-mentioned composition for cationic electrodeposition on the frame surface, and 2) thermally curing and drying the resultant film to obtain a cured electrodeposited coating.

In the step 1), a frame to be coated is immersed in an electrodeposition vessel charged with the composition for cationic electrodeposition. Voltage is then applied between the frame (as the negative electrode) and the positive electrode to deposit the polyimide resin (A) and the cationic polymer (B), or the cation-modified polyimide resin (A') on the frame surface. These steps form a polyimide resin-containing film on the frame surface. The electrodeposition coating is preferably carried out at a voltage of 100V to 220V for energization time of 30 to 240 seconds.

The thickness of the film (wet film) after performing of the electrodeposition coating is preferably 5 μm or more to less than 30 μm, and more preferably 7 μm or more to 25 μm or less. A too thin film after performing of the electrodeposition coating results in an electrodeposited coating, obtained by curing of the film, with unsatisfactory cohesive strength, and it becomes difficult to obtain desired heat resistance and/or film strength. A too thick film after performing of the electrodeposition coating may result in a course and orange peel-like surface which has poor surface smoothness, and it becomes difficult to obtain an electrodeposited coating with uniform thickness at the end of the steps. The thickness of the film after performing of the electrodeposition coating can be adjusted based on voltage and/or energization time during the electrodeposition coating.

The film obtained in step 1) is washed with water. In the subsequent step 2), the pellicle frame is baked at 120° C. to 260° C., more preferably 140° C. to 220° C., for 10 to 30 minutes to thermally cure the electrodeposited coating to obtain an electrodeposited coating.

The thickness of the electrodeposited coating (cured film) is substantially the same as that of the above-mentioned film, and preferably 5 μm or more to less than 30 μm, and more preferably 7 μm or more to 25 μm or less.

1-3. Method for Producing Pellicle Frame

As described above, the pellicle frame of the present invention can be produced by producing a frame, and forming a polyimide resin-containing film on the film. The method for producing the pellicle frame can be selected in accordance with the type of frame and/or the method for forming a film having a polyimide resin as appropriate.

When the frame is composed of an aluminum alloy, the pellicle frame can be produced by the steps of: anodizing the aluminum alloy frame, subjecting the surface of the aluminum alloy frame to blackening treatment, and coating (spray coating or electrodeposition coating) the aluminum alloy frame, which is subjected to the blackening treatment, with a polyimide resin-containing coating material to form a polyimide resin-containing film.

2. Pellicle

A pellicle of the present invention includes a pellicle membrane, the above-mentioned pellicle frame for supporting the periphery of the pellicle membrane, a membrane adhesive for bonding the pellicle frame to the pellicle membrane, and a mask adhesive for bonding the pellicle frame to a mask. FIG. 1 illustrates an example of the pellicle of the present invention. Pellicle 10 includes pellicle membrane 12 and pellicle frame 14 for supporting the periphery of pellicle membrane 12. Pellicle membrane 12 is stretched over pellicle frame 14 via membrane adhesive layer 13 provided on one end surface of pellicle frame 14. Mask adhesive layer 15 is provided on the other end surface of pellicle frame 14 for bonding pellicle frame 14 to a mask (not illustrated).

Pellicle membrane 12 is held by pellicle frame 14 and covers the exposure area of the mask (not illustrated). Therefore, pellicle membrane 12 has transparency such that energy (light) by exposure is not blocked. Examples of materials for pellicle membrane 12 include transparent materials such as quartz glass, a fluororesin, and cellulose acetate.

Membrane adhesive layer 13 bonds pellicle frame 14 to pellicle membrane 12. Mask adhesive layer 15 bonds pellicle frame 14 to the mask (not illustrated).

Membrane adhesive layer 13 may be, for example, an acrylic resin adhesive, an epoxy resin adhesive, a silicone resin adhesive, or a fluorine polymer, such as a fluorine-containing silicone adhesive or a fluorine-containing ether adhesive. Mask adhesive layer 15 may be, for example, a double-faced adhesive tape, a silicone resin adhesive, an acrylic adhesive, a rubber adhesive, a vinyl adhesive or epoxy adhesive.

Pellicle 10 is fixed on the mask (not illustrated) via mask adhesive layer 15 to prevent attachment of foreign particles to the mask (not illustrated). Any foreign particle attached on the mask being in focus of exposure light causes poor resolution on a wafer. Therefore, pellicle 10 is fixed to cover the exposure area of the mask (not illustrated).

The mask (not illustrated) is, for example, a glass substrate with a patterned light-blocking film disposed thereon. The light-blocking film is a mono- or multi-layered film made of metal such as Cr or MoSi. The mask having the patterned light-blocking film becomes the exposure area.

Exposure light used for lithography in, for example, a step of forming circuit patterns drawn on semiconductor devices may be light with a shorter wavelength, such as Hg lamp i-line (365 nm wavelength), KrF excimer laser (248 nm wavelength), or ArF excimer laser (wavelength 193 nm).

The polyimide resin-containing film on the pellicle frame of the present invention has satisfactory adherence to a metal (frame) and also excellent film strength. Further, the polyimide resin-containing film can reduce ion elution from the frame. Therefore, not only dust caused by peeling of the polyimide resin-containing film but also gas and/or foreign particles from the pellicle frame is less likely to be generated. The polyimide resin-containing film is less likely to be decomposed by irradiation with excimer laser light (such as ArF or KrF light). Accordingly, a pellicle including the pellicle frame is applicable for various types of patterning.

The pellicle can be produced by forming a layer composed of a membrane adhesive on the pellicle frame, followed by adhering a pellicle membrane to the membrane adhesive.

EXAMPLES

Hereinafter, the present invention will be described in detail with reference to examples; however, the present invention is not intended to be limited by these examples.

Example 1

An aluminum frame of JIS A7075-T6 (size: 149 mm×122 mm×5.8 mm height, supporting frame thickness: 2 mm) was provided. The frame was annealed at the temperature of 250° C. for 20 minutes in the atmosphere. The frame surface was then subjected to shot-blasting with stainless steel having an average diameter of about 100 μm. The frame was anodized using an electrolytic bath with 15 mass % of sulfuric acid at an electrolytic voltage of 20V and electric quantity of 10 C/cm$^2$. Subsequently, electrolytic deposition was performed at 30° C. by constant voltage electrolysis at an AC voltage of 15V for 6 minutes, using an electrolytic deposition bath with 160 g/L of nickel sulfate hexahydrate, 40 g/L of boric acid, 3 g/L of tartaric acid and 1 g/L of magnesium oxide dissolved therein, thereby obtaining a colored frame.

The obtained frame was washed with pure water, and subjected to electrodeposition coating in a bath containing a cationic polyimide-electrodeposition coating material (ELECOAT PI manufactured by Shimizu co., Ltd) at 25° C. and an voltage of 100V for one minute. The frame after subjected to the electrodeposition coating was washed with water, dried at 100° C. for 15 minutes, and baked at 180° C. for 30 minutes, thereby obtaining pellicle frame 1 having an electrodeposited coating (polyimide resin-containing film) with a thickness of 10 μm formed on the frame.

Example 2

Pellicle frame 2 was produced in substantially the same manner as in Example 1 except that the anodizing treatment and electrodeposition coating were performed under the following conditions.

(Anodizing Treatment)

Anodizing treatment was performed at 5° C., an electrolytic voltage of 30V and electric quantity of 10 C/cm$^2$, using an alkaline aqueous solution having 53 g/11 of sodium tartrate dihydrate and 4 g/L of sodium hydroxide dissolved therein as an electrolyte.

(Electrodeposition Coating)

The frame after subjected to the electrolytic deposition was washed with pure water, and placed in a bath containing a cationic polyimide-electrodeposition coating material (ELECOAT PI manufactured by Shimizu co., Ltd). Electrodeposition coating was then performed at 25° C. and a voltage of 100V for one minute, using a carbon plate as the positive electrode and the frame as the negative electrode. The frame was washed with water, dried and baked in the same manner as in Example 1, thereby obtaining an electrodeposited coating (polyimide resin-containing film) with a thickness of 9 μm.

Example 3

A frame-shaped aluminum alloy A7075 frame material (outer size: 148.95 mm×114.95 mm×2.50 mm thickness) was subjected to anodizing treatment under the following conditions. Subsequently, electrodeposition coating in the same manner as in Example 2 was performed to obtain pellicle frame 3 having an electrodeposited coating (polyimide resin-containing film) with a thickness of 5 to 20 μm formed thereon.

(Anodizing Treatment)

Anodizing treatment was performed using an alkaline aqueous solution having an inorganic acid hydrate dissolved therein as an electrolyte under the conditions such that the pH of the solution was 12 to 14, a bath temperature was 0 to 20° C., a voltage was 0.5V or more to less than 20V and a treating time was 2 to 120 minutes.

Example 4

A frame-shaped aluminum alloy A7075 frame material (outer size: 148.95 mm×114.95 mm×2.50 mm thickness) was subjected to anodizing treatment in the same manner as in Example 3. Subsequently, electrodeposition coating was performed using an anionic polyimide-electrodeposition coating material manufactured by PI R&D Co., Ltd to obtain pellicle frame 4 having an electrodeposited coating (polyimide resin-containing film) with a thickness of 5 to 20 μm formed thereon.

The visual observation of the appearance confirmed that the surface of the electrodeposited coating (polyimide resin-containing film) of pellicle frame 4 was course as compared to that of pellicle frame 3.

Example 5

A frame material was subjected to anodizing treatment in the same manner as in Example 3. Subsequently, a polyimide coating material manufactured by I.S.T Corporation was diluted with a diluting solvent. Spray coating was performed using the diluted coating material to obtain pellicle frame 5 having a sprayed coating (polyimide resin-containing film) with a thickness of 0.5 to 20 μm formed thereon.

Comparative Example 1

Pellicle frame 6 was produced in substantially the same manner as in Example 1 except that sealing treatment was performed under the following conditions in place of the electrodeposition coating.

(Sealing Treatment)

The frame after subjected to the electrolytic deposition was placed in a vapor sealing device and subjected to sealing treatment at a relative humidity of 100% for 30 minutes while 2.0 kg/cm$^2$ G of 130° C. vapor was generated.

Comparative Example 2

Pellicle frame 7 was produced in substantially the same manner as in Example 2 except that sealing treatment was performed under the following conditions in place of the electrodeposition coating.

(Sealing Treatment)

The frame after subjected to the electrolytic deposition was placed in a vapor sealing device and subjected to sealing treatment at a relative humidity of 100% for 30 minutes while 2.0 kg/cm$^2$ G of 130° C. vapor was generated.

Comparative Example 3

Pellicle frame 8 was produced in substantially the same manner as in Example 1 except that an acrylic resin-electrodeposition coating material (ELECOAT NICELON manufactured by Shimizu co., Ltd) was used for the electrodeposition coating in place of the cationic polyimide-electrodeposition coating material (ELECOAT PI manufactured by Shimizu co., Ltd), and a carbon plate was used as the negative electrode and the frame as the positive electrode. The thickness of the obtained electrodeposited coating (acrylic resin-containing film) was 10 μm.

[Evaluation]

1) Evaluation of Generated Gas Amount

Each of the pellicle frames obtained in Examples 1 and 5 and Comparative Example 3 was cut into pieces of about 4 cm length to produce a sample for measurement. Each sample for measurement was placed in a drum-shaped quartz cell having two screw caps. A line for allowing nitrogen gas to flow was attached to one of the screw caps and nitrogen gas flowed at the rate of 100 mL/min. A trap tube (TRAP TUBE, TENAX GL, manufactured by GL Sciences Inc.) was attached to the other screw cap. When oxygen is present, ArF laser changes the oxygen into ozone which degrades the trapping material in the trap tube, and thus gas generated from a sample may not be trapped. Using nitrogen gas prevents this failing. After the screw cap was fully purged with nitrogen, the sample for measurement in the drum-shaped quartz cell was irradiated with ArF laser at 1000 Hz and 0.4 mJ/cm$^2$ for 5 minutes.

A generated gas sample was obtained by collecting into the trap tube a substance(s) removed from the surface of the sample for measurement as gas by the irradiation of ArF laser.

The amount of the substance(s) collected in the trap tube was then measured using a thermal desorption gas chromatograph/mass spectrometer (GC-MS), as the generated gas amount (in terms of undecane). Thermal desorption GC-MS TDTS-2010, gas chromatograph GC-2010 and mass spectrometer GCMS-QP2010 (all manufactured by Shimadzu Corporation) were used for the measurement. Table 1 shows the results of the measurements.

TABLE 1

| | Outgassed amount |
|---|---|
| Ex. 1 | 0.15 μg |
| Ex. 5 | 0.13 μg |
| Comp. Ex. 3 | 0.68 μg |

As shown in Table 1, the outgassed amounts were low for the electrodeposited coating (polyimide resin-containing film) of the pellicle frame in Example 1 and the sprayed coating (polyimide resin-containing film) of the pellicle frame in Example 5 as compared to the electrodeposited coating (acrylic resin-containing film) of the pellicle frame in Comparative Example 3. It is deduced that the polyimide resin-containing films of Examples 1 and 5 were resistant to decomposition by ArF excimer laser light.

In view of the fact that the ArF laser light (wavelength: 193 nm) absorption coefficient is about 0.15 μm$^{-1}$ for an acrylic resin and about 20 μm$^{-1}$ for a polyimide resin, and generally accepted assumption that the more light energy absorption becomes, the more instability is caused, it is deduced that a polyimide resin which is more likely to absorb ArF laser light is less resistant to decomposition when solely the light absorption coefficients are compared.

However, as shown in Table 1, the irradiation of the actual ArF laser light gave the results opposite to the deduction. The present inventors have performed electronic state analysis on the basis of computational approach for studying the reason why the polyimide resin-containing films were more resistant to decomposition than the acrylic resin-containing film was.

The electronic state calculation was performed using Gaussian 09 Rev. D. 01. The binding energies of a polyimide resin and an acrylic resin in the excited singlet states (S1) were then evaluated by TD-CAM-B3LYP method, i.e., a density functional theory with cc-pVDZ as the base function.

It was found that in the molecular skeleton of the polyimide resin, the binding energies of moieties of N—C bond and C—O bond in the S1 state, which are to be starting points of reactions, were 366 kJ/mol and 269 kJ/mol, respectively. It is considered that the polyimide resin was resistant to decomposition by ArF laser light due to its satisfactorily high binding energies in the S1 state, and thus gas was less likely to be generated.

In the acrylic resin, on the other hand, the energy of O—C bond in O=C—O—C moiety in the S1 state is relatively low value of 63 kJ/mol, and thus the decomposition by ArF laser light may have easily occurred. Further, in the acrylic resin, O=C—O side chain is β-cleaved with 74 kJ/mol of activation energy and removed as $CO_2$. Radicals are produced in the main chain moiety, and thus cleavages in the main chain are more likely to progress. From the foregoing, gas was more likely to be generated from the acrylic resin by ArF laser light.

2) Measurement of Ion Elution Amount

Into a heat-resistant zippered bag manufactured by Asahi Kasei Corporation (ZIPLOC (Registered Trademark)), 100 ml of ultrapure water was poured. Three pellicle frames produced in each of Examples 1 to 5 and Comparative Examples 1 and 2 were put into the bag. After air in the bag was removed, the bag was sealed with the zipper. The heat-resistant bag was then immersed in a water bath with a high temperature of 90° C. for three hours to extract various ions contained in the pellicle frames. The amount of the various ions contained in the extraction liquid was measured using ion chromatography analyzing apparatus (ICS-1000, manufactured by DIONEX Corporation (Column: AS9-HC)). The eluent was 1 mmol/L $K_2CO_3$ solution. Table 2 shows the types of ions eluted from each three pellicle frames and the amounts thereof.

TABLE 2

| | Method for producing pellicle frame | | Ion elution amount | | |
|---|---|---|---|---|---|
| | Treatment liquid for anodizing treatment | Surface treatment after anodizing treatment | Acetate ion (ppm) | Formate ion (ppm) | Sulfate ion (ppm) |
| Ex. 1 | Sulfuric acid | Electrodeposition coating (containing polyimide resin) | 0.2539 | 0.0613 | 0.0134 |
| Ex. 2 | Tartaric acid | Electrodeposition coating (containing polyimide resin) | 0.0965 | 0.0068 | Unable to separate peak |
| Ex. 3 | Inorganic acid | Electrodeposition coating (containing polyimide resin) | 0.0763 | 0.0712 | Unable to separate peak |
| Ex. 4 | Inorganic acid | Electrodeposition coating (containing polyimide resin) | 0.0328 | 0.0365 | Unable to separate peak |
| Ex. 5 | Inorganic acid | Spray coating (containing polyimide resin) | 0.0328 | 0.0365 | Unable to separate peak |
| Comp. Ex. 1 | Sulfuric acid | Sealing treatment | 6.2183 | Unable to separate peak | 0.0372 |
| Comp. Ex. 2 | Tartaric acid | Sealing treatment | 0.0832 | 0.0383 | No data |

As shown in Table 2, each ion elution amount was smaller when a polyimide resin-containing film was formed after the anodizing treatment than when sealing treatment was performed after the anodizing treatment (comparison between Example 1 and Comparative Example 1, and between Examples 2 to 5 and Comparative Example 2). These results teach that a polyimide resin-containing film enables reduction of elution of various ions which were attached during the anodizing treatment.

This application claims priority based on Japanese Patent Application No. 2015-160519, filed on Aug. 17, 2015, the entire contents of which including the specification and the drawings are incorporated herein by reference.

INDUSTRIAL APPLICABILITY

The polyimide resin-containing film included in the pellicle frame of the present invention has excellent film strength and corrosion resistance while maintaining satisfactory adherence to metal. This makes possible to highly reduce dust which was caused by peeling of the polyimide resin-containing film, ion elution from the pellicle frame, and generation of outgassing. Further, the polyimide resin-containing film is less likely to be decomposed by irradiation with excimer laser light (such as ArF or KrF light). Accordingly, a pellicle including the pellicle frame is applicable for various types of patterning.

REFERENCE SIGNS LIST

10 Pellicle
12 Pellicle membrane
13 Membrane adhesive layer
14 Pellicle frame
15 Mask adhesive layer

The invention claimed is:

1. A pellicle frame for supporting a periphery of a pellicle membrane, which comprises:
   a frame, and a polyimide resin-containing film formed on a surface of the frame,
   wherein the polyimide resin-containing film is a cationic electrodeposited coating film.

2. The pellicle frame according to claim 1, wherein the frame is an aluminum alloy frame subjected to anodizing treatment.

3. The pellicle frame according to claim 1, wherein the cationic electrodeposited coating film is a cured film of a composition containing a polycondensation polyimide resin, a thermally crosslinked imide resin and a cationic polymer.

4. The pellicle frame according to claim 1, wherein a thickness of the polyimide resin-containing film is 25 μm or less.

5. The pellicle frame according to claim 1, wherein the frame is black.

6. A pellicle comprising:
a pellicle membrane, and
the pellicle frame according to claim 1, which is for supporting a periphery of the pellicle membrane.

7. A method for producing a pellicle frame for supporting a periphery of a pellicle membrane, which comprises:
anodizing an aluminum alloy frame,
subjecting a surface of the aluminum alloy frame to blackening treatment, and
further subjecting the aluminum alloy frame subjected to the blackening treatment to cationic electrodeposition coating with a polyimide resin-containing coating material, to form a polyimide resin-containing film.

8. A method for producing a pellicle comprising a pellicle membrane and a pellicle frame for supporting a periphery of the pellicle membrane, which comprises:
adhering the pellicle membrane to the pellicle frame which is produced by the method according to claim 7 for producing the pellicle frame.

\* \* \* \* \*